United States Patent
Wang et al.

(10) Patent No.: US 7,586,176 B2
(45) Date of Patent: Sep. 8, 2009

(54) SEMICONDUCTOR DEVICE WITH CRACK PREVENTION RING

(75) Inventors: Ping-Wei Wang, Hsin-Chu (TW); Chii-Ming Morris Wu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 11/788,208

(22) Filed: Apr. 19, 2007

(65) Prior Publication Data
US 2007/0194409 A1    Aug. 23, 2007

Related U.S. Application Data

(62) Division of application No. 10/891,955, filed on Jul. 15, 2004, now Pat. No. 7,223,673.

(51) Int. Cl.
*H01L 23/544* (2006.01)
(52) U.S. Cl. ........................ 257/620; 257/758
(58) Field of Classification Search ............... 257/620, 257/758
See application file for complete search history.

(56) References Cited

U.S. PATENT DOCUMENTS

| 5,891,808 | A | 4/1999 | Chang et al. |
| 6,022,791 | A * | 2/2000 | Cook et al. ............ 438/458 |
| 6,162,583 | A | 12/2000 | Yang et al. |
| 6,300,223 | B1 * | 10/2001 | Chang et al. ............ 438/460 |
| 6,412,786 | B1 | 7/2002 | Pan |
| 6,566,735 | B1 | 5/2003 | Minn et al. |
| 2004/0147097 | A1 * | 7/2004 | Pozder et al. ............ 438/584 |
| 2005/0093169 | A1 | 5/2005 | Kajita |

* cited by examiner

*Primary Examiner*—Thien F Tran
(74) *Attorney, Agent, or Firm*—Slater & Matsil, L.L.P.

(57) ABSTRACT

A crack prevention ring at the exterior edge of an integrated circuit prevents delamination and cracking during the separation of the integrated circuits into individual die. The crack prevention ring extends vertically into a semiconductor workpiece to at least a metallization layer of the integrated circuit. The crack prevention ring may be formed simultaneously with the formation of test pads of the integrated circuits. The crack prevention ring may be partially or completely filled with conductive material. An air pocket may be formed within the crack prevention ring beneath a passivation layer of the integrated circuit. The crack prevention ring may be removed during the singulation process.

17 Claims, 9 Drawing Sheets

SEMICONDUCTOR DEVICE WITH CRACK PREVENTION RING

CROSS-REFERENCE TO RELATED APPLICATIONS

This application is a divisional of patent application Ser. No. 10/891,955, entitled "Semiconductor Device with Crack Prevention Ring and Method of Manufacture Thereof," filed Jul. 15, 2004 now U.S. Pat. No. 7,223,673, which application is incorporated herein by reference.

TECHNICAL FIELD

The present invention relates generally to semiconductor devices, and more particularly to the formation of a seal ring at the edge of an integrated circuit to prevent delamination and cracks in insulating layers of the integrated circuit during die separation.

BACKGROUND

In the evolution of integrated circuits in semiconductor technology, there has been a trend towards device scaling. Scaling or reducing the size increases circuit performance, primarily by increasing circuit speed, and also increases the functional complexity of the integrated circuits. The number of devices per integrated circuit (also referred to in the art as a chip or die) has increased throughout the years. When integrated circuits contained only a small number of devices per chip, the devices could be easily interconnected in a single level. However, the need to accommodate more devices and increased circuit speed has led to the use of multi-level or multi-layer interconnects.

In a multi-level interconnection system, the area needed by the interconnect lines is shared among two or more levels, which increases the active device fractional area, resulting in increased functional chip density. Implementing a multilevel interconnect process to a fabrication scheme increases the complexity of the manufacturing process. Typically, the active devices (e.g., the transistors, diodes, capacitors and other components) are manufactured in the lower layers of wafer processing. After the active devices are processed, the multilevel interconnects are usually formed. Hundreds or thousands of chips or die are typically manufactured on a single wafer. The die are separated after the manufacturing process is complete by sawing the die apart on scribe lines at edges of each die. The die are then individually packaged, or are packaged in multi-chip modules, as examples.

As semiconductor devices continue to shrink, various aspects of multilevel interconnect processes are challenged. The propagation delay of integrated circuits becomes limited by the large RC time delay of interconnection lines when minimum feature size is decreased below about 1 μm, for example. Therefore, the industry is tending towards the use of different materials and processes to improve multilevel interconnect implementations. In particular, the change in the conductive materials and insulating materials used in multi-level interconnect schemes is proving challenging and requires a change in a number of processing parameters.

For many years, the insulating material used to isolate conductive lines from one another was silicon dioxide. Silicon dioxide has a dielectric constant (k) of approximately 4.0 or greater, where the dielectric constant value k is based on a scale where 1.0 represents the dielectric constant of vacuum. However, now there is a trend in the semiconductor industry towards the use of low-dielectric constant materials (e.g., having a dielectric constant k of about 3.5 or less) for insulating materials.

Integrated circuit manufacturers are employing finer circuit widths, low dielectric constant (low-k) materials, and other technologies to make smaller and higher-speed semiconductor devices. Along with these advancements, the challenges of maintaining yield and throughput have also increased. Low-k materials tend to be weaker and less robust than the silicon dioxide that was used as a dielectric material in the past. As far as reliability is concerned, the low-k material near die corners has a tendency to crack/delamination, especially in the sawing process to separate the die from one another. The cracks tend to occur in a direction parallel to the wafer surface.

In general, the scribe lines are defined in areas of the multi-layer structure that are without a die circuit pattern and have a width of about 80 to 120 μm, depending on the dimensions of the die manufactured on the wafer. Furthermore, when at least one layer of the multi-layer structure is composed of a metal material with a high thermal expansion coefficient, the dimensional variation of the layer is sufficient to introduce high-level internal stress into the wafer in the area of the scribe line. Consequently, portions of the wafer around the scribe line suffer damage, such as peeling, delamination, or dielectric fracture. The types of scribe line damage mentioned above are usually observed when the multi-layer structure includes an inter-metal-dielectric layer of low dielectric constant (low-k).

The stress resulting from the sawing process causes serious peeling starting from near the test keys at the die corners. This results in delamination at the interface between the multiple layers at the die corners. Delamination impacts the reliability of the device, and contributes to production of stringers (residual materials) that interfere with further processing and testing of the integrated circuit. It is not uncommon for stresses to crack a passivation film formed over the die corners during the sealing process of a resin mode package. If a low-k material is used near the guard ring corners, the crack issue becomes more serious and further reduces reliability.

SUMMARY OF THE INVENTION

These and other problems are generally solved or circumvented, and technical advantages are generally achieved, by preferred embodiments of the present invention, in which a crack prevention ring comprising a conductive material is formed near the edge of the integrated circuit die proximate the scribe line. The crack prevention ring preferably extends deep within the integrated circuit device vertically with respect to the workpiece, at least into a metallization layer of the integrated circuit. The crack prevention ring may comprise the conductive material that test pads for the semiconductor device comprise, and the crack prevention ring may either be lined with the conductive material or may be completely filled with the conductive material.

In one aspect, the present invention provides for a semiconductor device comprising an integrated circuit. The integrated circuited includes a plurality of metallization layers, the plurality of metallization layers comprising a first metallization layer and at least one second metallization layer disposed over the first metallization layer, wherein each metallization layer is formed in an insulating layer. A scribe line is adjacent the integrated circuit. A seal ring substantially surrounds the integrated circuit, and a crack prevention ring is disposed around an exterior edge of the integrated circuit. The crack prevention ring is interjacent the seal ring and the scribe line and comprises a conductive material and extending into at least the at least one second metallization layer.

In another aspect, the present invention provides for a semiconductor device comprising a semiconductor wafer, wherein a plurality of integrated circuits are formed on the semiconductor wafer. A series of scribe lines are interjacent and separate respective ones of the plurality of integrated circuits. At least one of said plurality of integrated circuits includes a first metallization layer extending a first depth from a top surface of the integrated circuit, and at least one second metallization layer disposed over the first metallization layer and extends a second depth from the top surface of the integrated circuit. A seal ring is formed around a periphery of the at least one integrated circuit, and a crack prevention ring is formed in a trench along the periphery of the at least one integrated circuit, wherein the trench is located between the seal ring and the adjacent scribe line, and wherein the trench extends at least to the second depth of the at least one second metallization layer.

An advantage of embodiments of the present invention includes a crack prevention ring at the edges of an integrated circuit die that prevents cracking and delaminating of the dielectric material of the integrated circuit during the separating of the die into individual die. The crack prevention ring comprises a conductive material which has a high mechanical strength and is robust. The conductive material of the crack prevention ring is formed perpendicular to the crack direction/wafer direction, thereby providing structural support for the edges of the integrated circuit die during the singulation process. The crack prevention ring may be formed while test pads of the integrated circuit are being formed, for example, in the scribe line region. Device yields are improved, resulting in a cost savings.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a semiconductor device having low dielectric constant materials as insulating layers. Embodiments of the invention may also be applied, however, to other semiconductor devices comprising more traditional dielectric materials and ultra-low dielectric constant materials, as examples.

Figure 1:
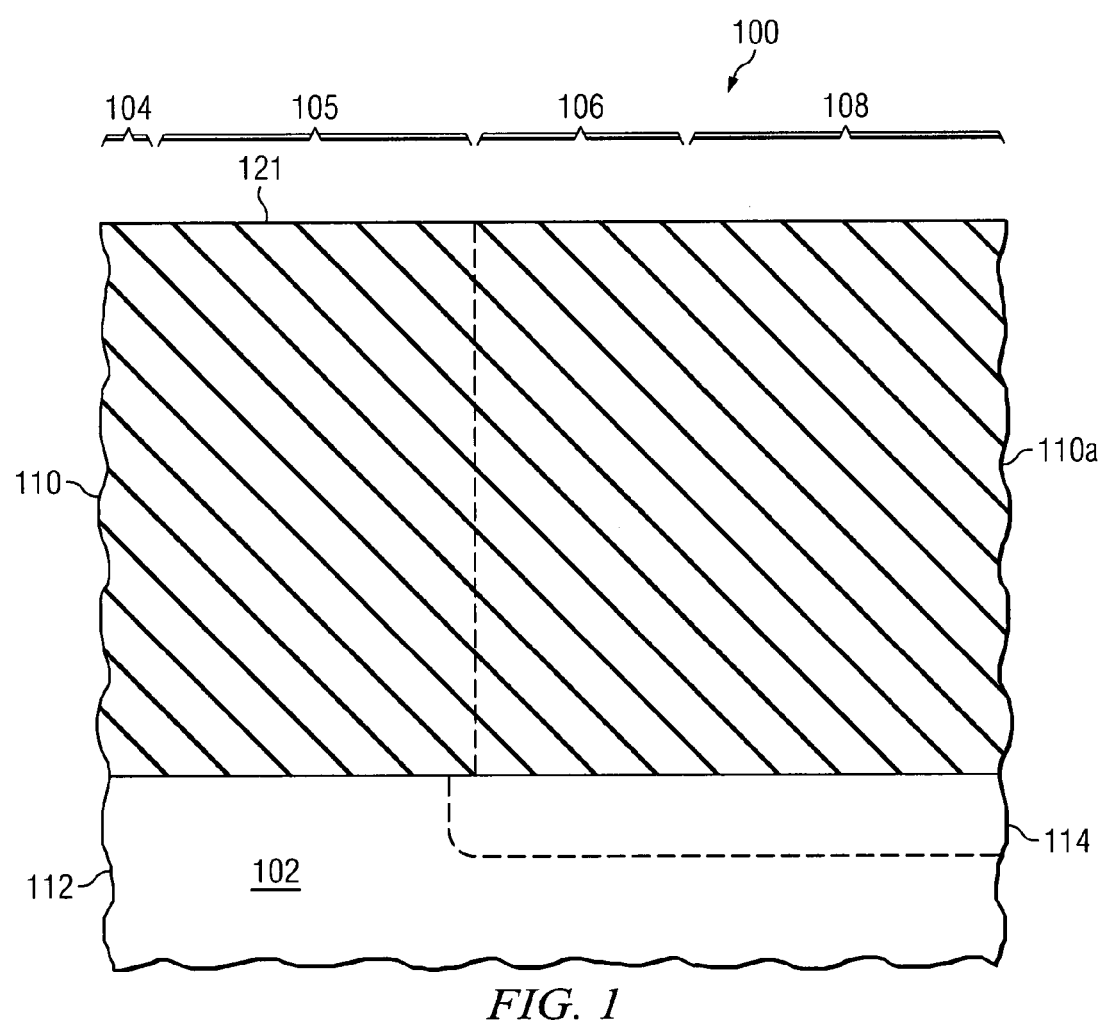
FIGS. 1 through 5 and 6a show cross-sectional views of a semiconductor device at various stages of manufacturing in accordance with an embodiment of the present invention, wherein a crack prevention ring is formed proximate the scribe lines of an integrated circuit.

FIGS. 1 through 5 and 6a show cross-sectional views of a semiconductor device at various stages of manufacturing in accordance with an embodiment of the present invention. Referring first to FIG. 1, a workpiece 102 is provided. The workpiece 102 includes a plurality of integrated circuit regions 104. Only one integrated circuit region 104 is shown in the drawings herein; however, there may be hundreds or thousands of integrated circuit regions 104 on a single workpiece 102. After the semiconductor device 100 is manufactured, the plurality of integrated circuit regions 104 will be separated or singulated at a scribe line region 108 surrounding each integrated circuit region 104. The workpiece 102 may include an optional seal ring region 105 proximate the scribe line region 108 and proximate each edge of the integrated circuit region 104, as shown.

In accordance with an embodiment of the present invention, a crack prevention ring region 106 is defined in the workpiece 102 proximate the exterior edge of the integrated circuit region 104, adjacent the scribe line region 108. Optionally, the scribe line region 108 may include the crack prevention ring region 106, in one embodiment. In another embodiment, the scribe line region 108 may also include an optional seal ring region 105, to be described further herein.

The semiconductor device 100 may include a plurality of insulating, conductive, and semiconductive layers 110 formed over the workpiece 102. In one embodiment, in the crack prevention ring region 106 and scribe line region 108, preferably, layer 110a is absent any conductive layers, to be described further herein. The workpiece 102 may include portions of integrated circuits 112 formed within the workpiece 102. For example, active areas 112 may be formed within a top surface of the workpiece 102, wherein the active areas 112 comprise transistors and other electrical components of an integrated circuit. The various insulating layers, conductive layers, and semiconductive layers 110 also comprise a portion of an integrated circuit. A shallow trench isolation (STI) region 114, shown in phantom, may be formed within portions of the workpiece 102, as shown.

Preferably, the top surface 121 of a portion of the integrated circuit region 104 comprises a conductive material. For example, the top surface 121 may comprise a conductive line formed in a metallization layer. Contact pads may be formed over the conductive top surface 121 in subsequent process steps. Also, in accordance with an embodiment of the present invention, preferably, no metallization layers or conductive layers are formed in the crack prevention ring region 106.

Figure 2:
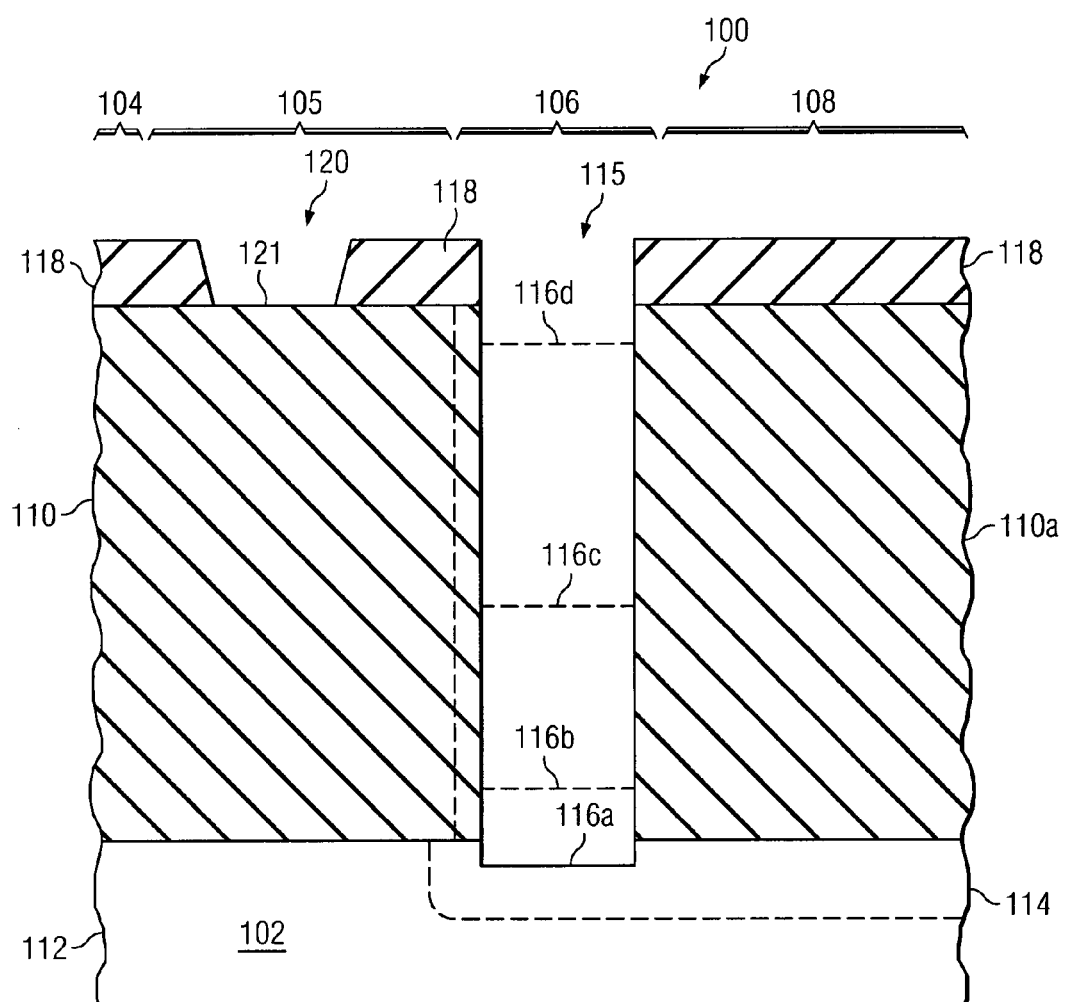

A first insulating layer 118 is deposited over the workpiece 102, as shown in FIG. 2. The first insulating layer 118 preferably comprises a dielectric material such as silicon dioxide, and may alternatively comprise a nitride, or other types of passivation material and dielectric materials, as examples. The first insulating layer 118 preferably comprises a thickness of about 2 μm or less, for example. The first insulating layer 118 is also referred to herein as a passivating layer.

Next, in accordance with embodiments of the present invention, the first insulating layer 118 is patterned to form an aperture 120 for an optional seal ring in the seal ring region 104 and a crack prevention ring trench 115 in the crack prevention ring region 106. The apertures 120 and trench 115 are preferably simultaneously formed in one embodiment. Advantageously, the same lithography step may be used to form the aperture 120 for the seal ring and the crack prevention ring trench 115. Alternatively, the crack prevention ring trench 115 and the seal ring aperture 120 may be formed in separate lithography steps, for example.

The etch process is adapted to stop upon reaching the conductive top surface 121 in the seal ring region 105. The aperture 120 for the seal ring is thus preferably formed only in the thickness of the first insulating layer 118. However, because there are no conductive layers in layer 110a of the crack prevention ring region 106, in the crack prevention ring region 106, the etch process continues through the first insulating layer 118, and further into at least a portion of the plurality of insulating and semiconductive layers 110a, to a depth indicated at 116a, 116b, 116c, or 116d, as examples. The crack prevention ring trench 115 preferably comprises a depth of about 1 to 8 μm and a width of about 0.3 to 10 μm, for example. The crack prevention ring trench 115 preferably extends at least through the entire thickness of the top-most metallization layer of the integrated circuit (not shown in FIG. 2; see FIG. 8). The crack prevention ring trench 115 preferably has an aspect ratio of about 3:1 or greater.

In accordance with preferred embodiments of the present invention, the crack prevention ring trench 115 extends completely through the integrated circuit region 110 and into a top surface of the workpiece 102, e.g., at 116a, as shown. In one embodiment, the crack prevention ring trench 115 extends within and into the entire thickness or a portion of a thickness of an STI region 114. Alternatively, the crack prevention ring trench 115 may extend within the plurality of insulating and semiconductive layers 110a by a variety of distances into corresponding layers of the integrated circuit region 110, e.g., as shown at 116b, 116c, and 116d in phantom. Preferably, in accordance with embodiments of the present invention, the crack prevention ring trench 115 extends within the integrated circuit region 110a into an entire thickness of at least one metallization layer in integrated circuit region 110 in the integrated circuit region 104.

Figure 3:
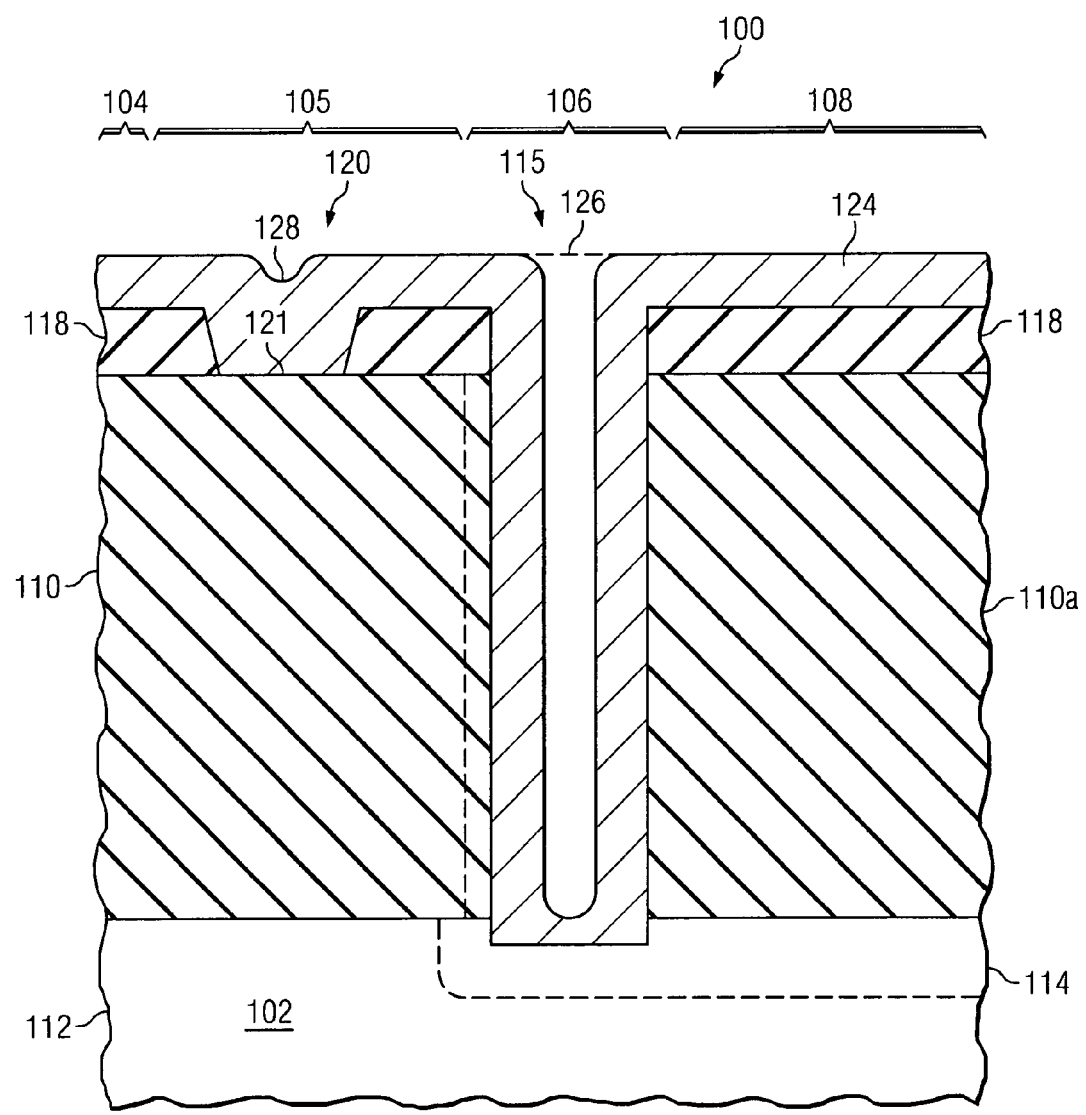

A conductive material 124 is deposited over the patterned first insulating layer 118, as shown in FIG. 3. In one embodiment, the conductive material 124 lines the seal ring trench 115 and does not completely fill the seal ring trench 115. Alternatively, in another embodiment, the conductive material 124 completely fills the seal ring trench 115, so that the conductive material 124 comprises a substantially planar surface 126 over the seal ring trench 115, as shown in phantom (see also FIG. 6b). The conductive material 124 may form a recess 128 over the aperture 120 for the optional seal ring, as shown. Preferably, the conductive material 124 comprises copper, aluminum, silver, tungsten, metal nitride, metal alloy, copper alloy, aluminum alloy, composites thereof, or combinations thereof, as examples, although alternatively, other materials may be used for the conductive material 124. The conductive material 124 is preferably deposited in a thickness of about 2000 nm or less, for example. Alternatively, the conductive material 124 may comprise other dimensions.

Figure 4:
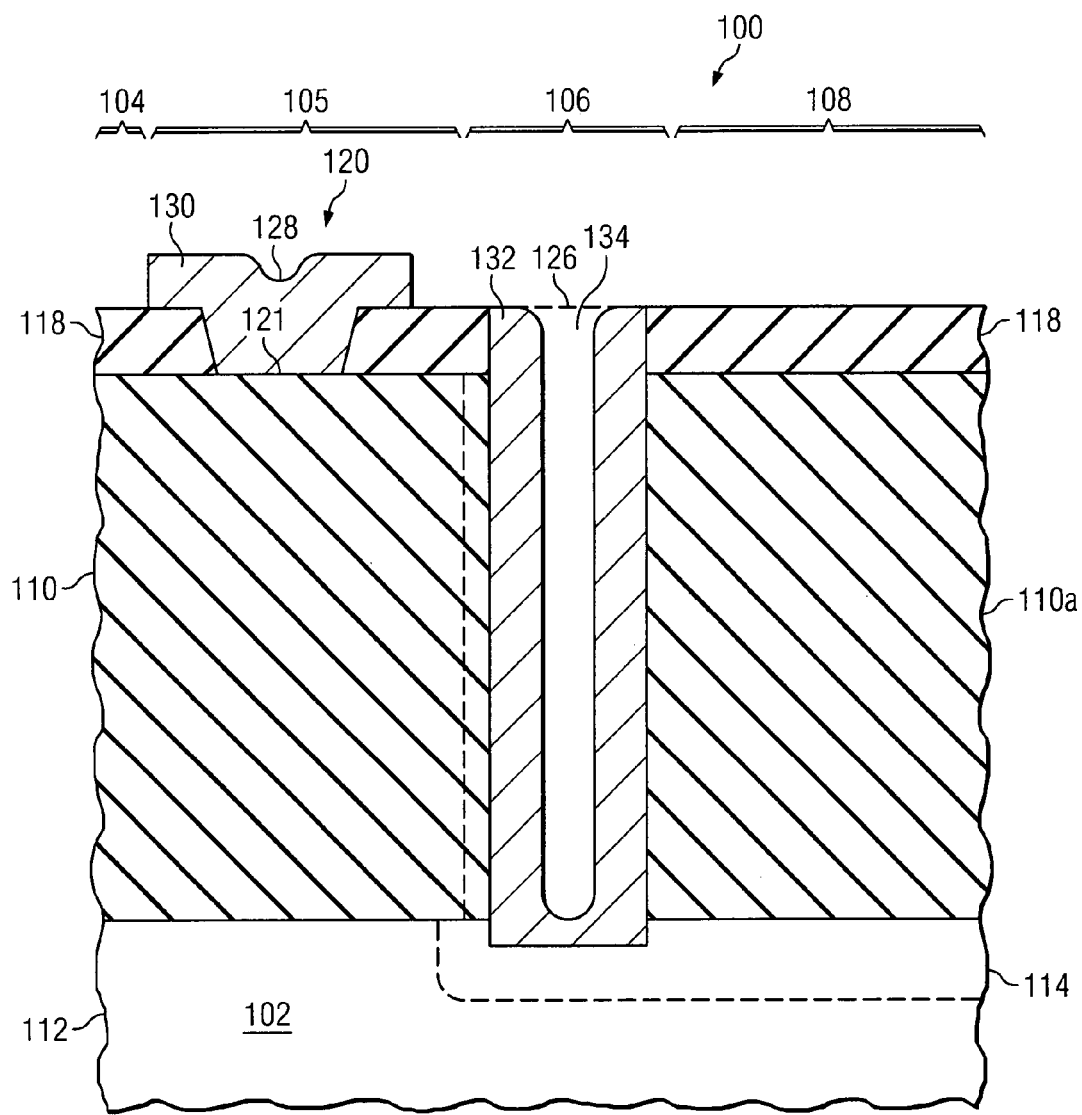

The conductive material 124 is patterned and etched to form (optionally) a seal ring 130 in the integrated circuit region 104, and to form the novel crack prevention ring 132 or 134 around each integrated circuit region 104 in accordance with embodiments of the present invention, as shown in FIG. 4. Test pads 156 may also be formed in the scribe line region 108 (not shown in FIG. 4; see FIG. 7). The test pads 156 may be used to perform electrical tests on the integrated circuit in the integrated circuit region 104 at various stages of the manufacturing process. For example, if the testing using test pads 156 results in a large number of device failures, the workpiece may be scrapped early in the manufacturing process, resulting in avoiding continue to manufacture a workpiece that exhibits electrical problems.

Referring again to FIG. 4, preferably the seal ring 130 and crack prevention ring 132 or 134 (and also optional test pads 156) are patterned simultaneously, using the same lithography mask and patterning step. The conductive material 124 may be patterned using traditional lithography techniques, for example. A photoresist may be deposited over the conductive material 124 (not shown), and the photoresist may be patterned and exposed, and then the photoresist may be used as a mask to pattern the underlying conductive material 124. Alternatively, the conductive material 124 may be directly patterned, for example.

Note that in one embodiment, after the patterning of the conductive material 124, the crack prevention ring 132 or 134 may comprise a completely filled trench, as shown in phantom at 134, or alternatively, the crack prevention ring 132 may comprise a lined trench having a void or air pocket 142 (not shown in FIG. 4; see FIG. 5) therein.

Figure 5:
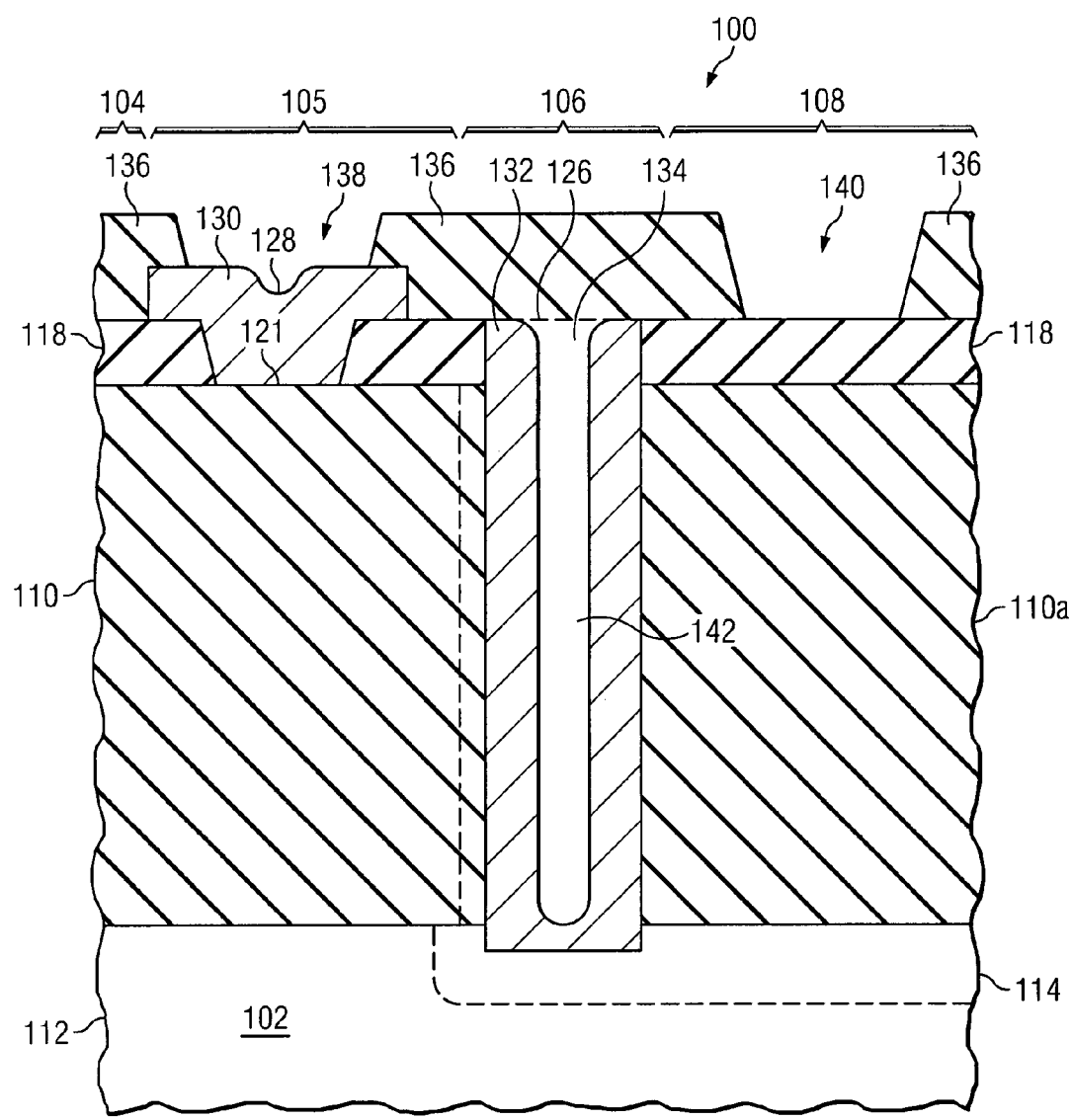

Next, a second insulating layer 136 is deposited over the first insulating layer 118, seal ring 130, and crack prevention ring 132 or 134, as shown in FIG. 5. The second insulating layer 136 may comprise similar materials as described for the first insulating layer 118, for example. The second insulating layer 136 preferably comprises a thickness of about 2 μm or less, for example. If the crack prevention ring 132 lines the trench 115 rather than filling it, then an air pocket 142 is formed within the crack prevention ring 132 beneath the second insulating layer 136 in the crack prevention ring region 106, as shown.

The second insulating layer 136 is patterned using lithography to form an aperture 138 over the seal ring 130 and to form an aperture 140 over a scribe line in the scribe line region 108. Advantageously, apertures 138 and 140 may be patterned in a single lithography step. The second insulating layer 136 preferably remains unpatterned and intact in the seal ring region 106, as shown.

Figure 6A:
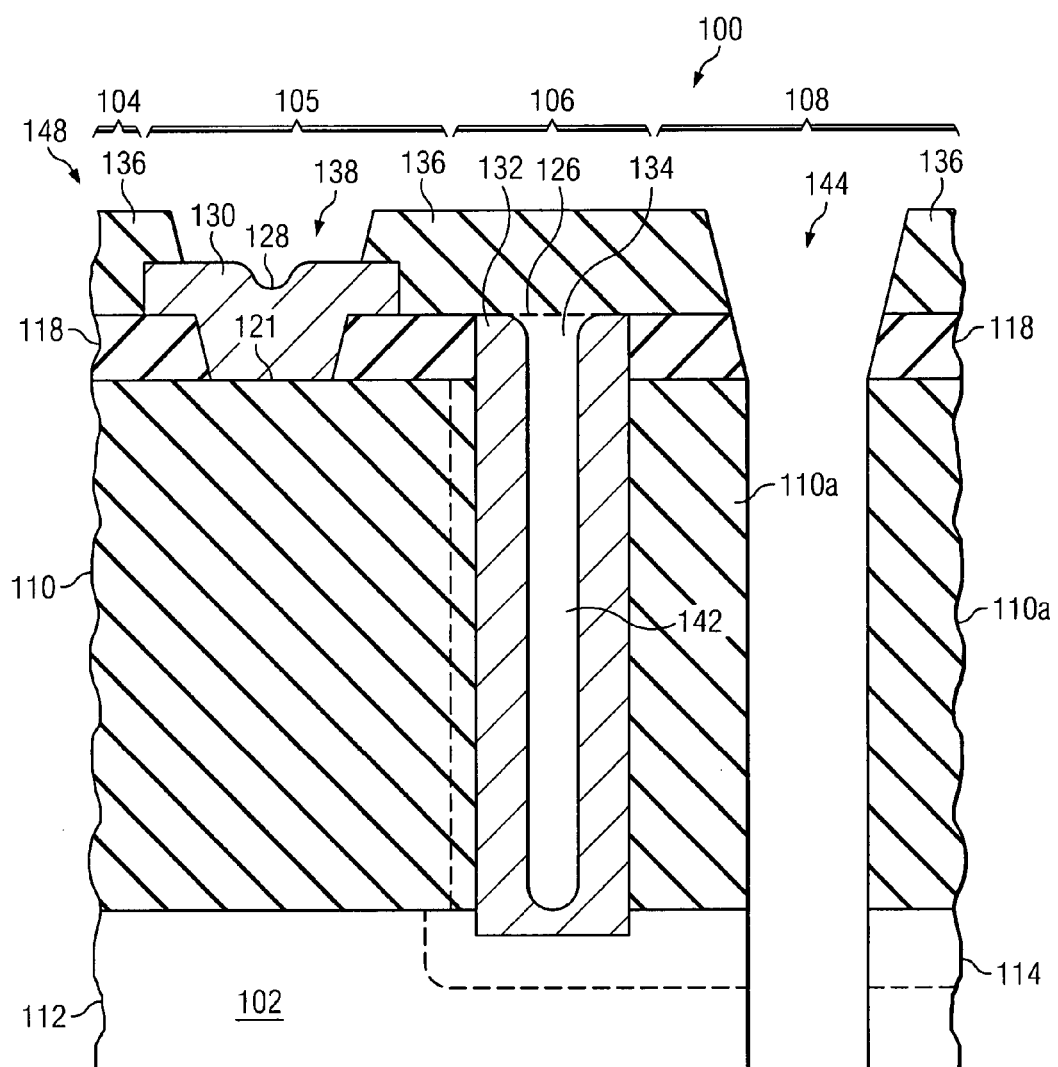

The workpiece 102 is then subjected to a singulation process in order to separate the integrated circuit regions 104 from one another to form individual integrated circuit die 148, as shown in FIG. 6a. In particular, the plurality of integrated circuit regions 104 of the workpiece 102 are separated at the scribe line regions 108 by making a cut or saw line 144 along the scribe line regions 108 to form individual die 148, as shown. The plurality of integrated circuit regions 104 may be separated utilizing diamond sawing, laser cutting, liquid jet scribing, water jet cutting, or combinations thereof, as examples. The separating of the plurality of integrated circuit regions 104 may alternatively comprise other methods. The individual die 148 may then be packaged, with contact pads (not shown; the contact pads reside elsewhere over the workpiece 102) being bonded to leads of the package so that electrical connection can be made to the die 148.

Figure 6B:
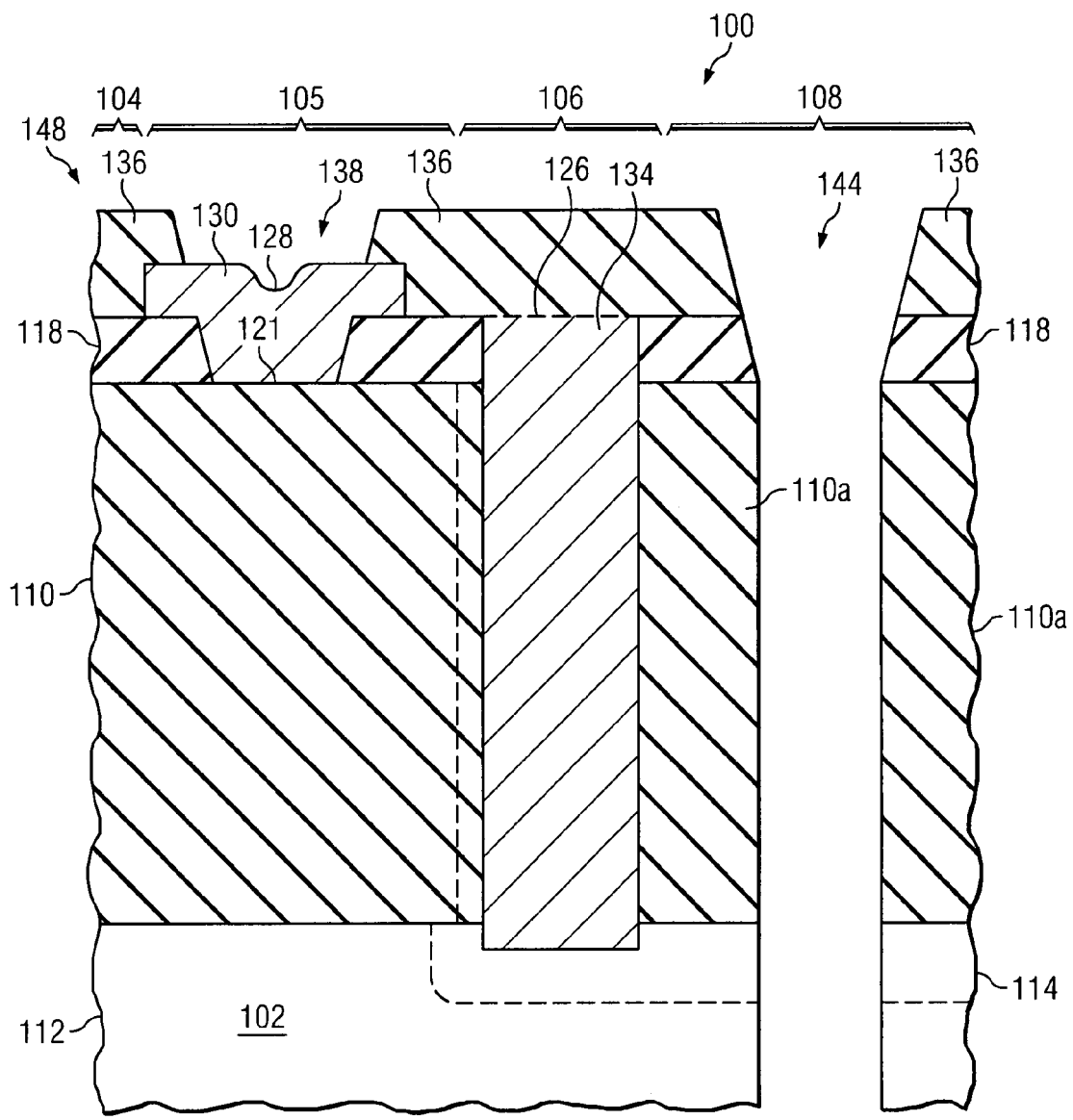
FIG. 6b shows another embodiment of the invention, wherein the crack prevention ring trench is completely filled with a conductive material.

FIG. 6b shows another embodiment of the present invention, wherein the crack prevention ring 134 is completely filled with the conductive material 124 (see FIG. 3).

In one embodiment, the crack prevention ring 132 or 134 is located very close to the scribe line 144. The crack prevention ring 132 or 134 may be located within the scribe line region 108, for example. In this embodiment, the crack prevention ring 132 or 134 is removed during the sawing process to singulate the die (not shown). The seal ring 130 may also be removed during the sawing process (also not shown). In another embodiment, the crack prevention ring 132 or 134 preferably remains after the singulation process. In this embodiment, the crack prevention ring 132 or 134 may be electrically grounded to reduce noise and/or protect against damage from electro-static discharge (ESD), as examples.

Figure 7:
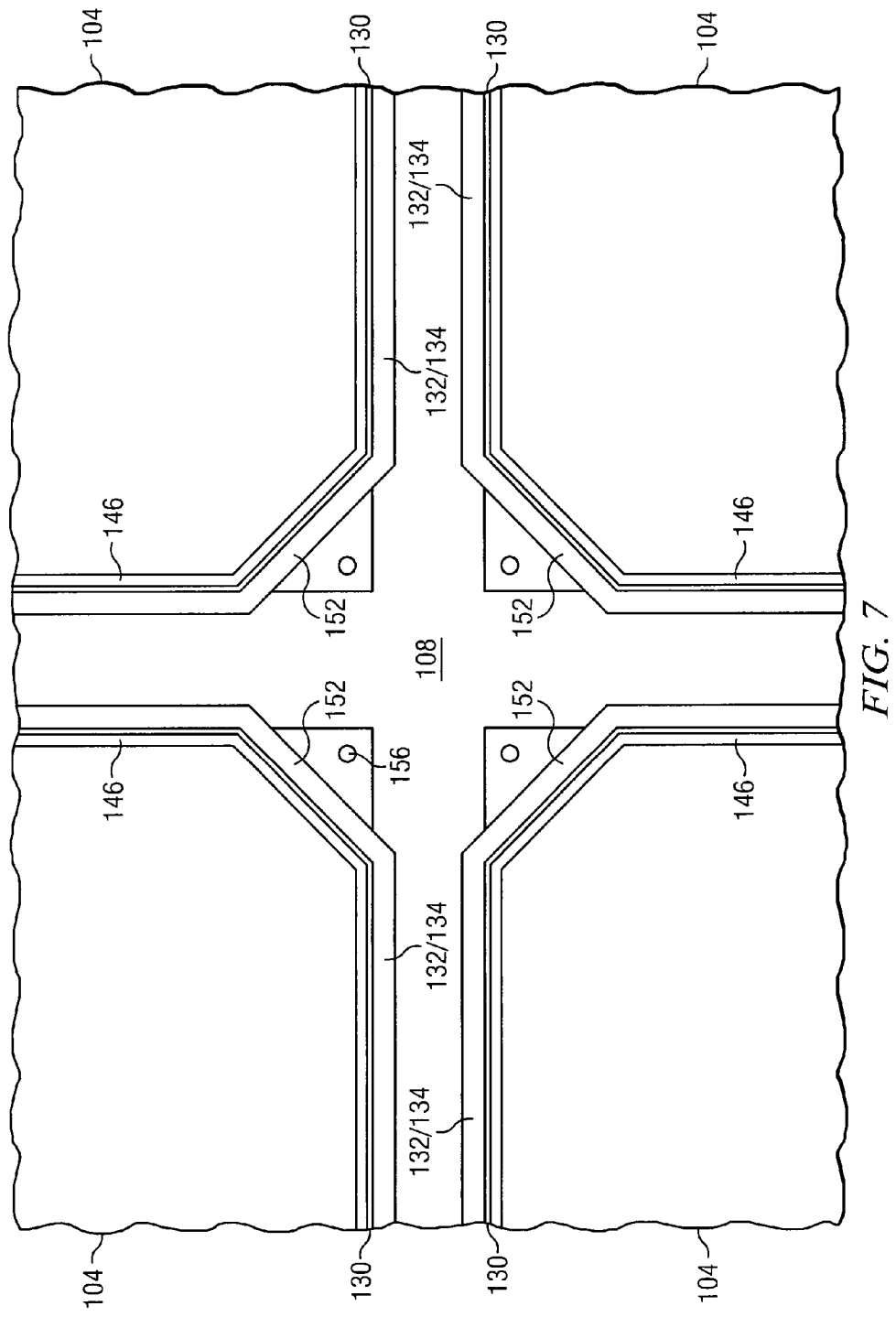
FIG. 7 shows a top view of the semiconductor device shown in FIGS. 1 through 6 prior to the singulation process.

FIG. 7 shows a top view of the semiconductor device shown in FIGS. 1 through 6 prior to the singulation process. Shown in FIG. 7 is a view of four integrated circuit regions 104 at their corner regions. As can be seen from this top view, the scribe line region 108 extends along the side edges of the integrated circuit regions 104 and along the bottom and top edges of the integrated circuit regions 104. The crack prevention ring 132/134 described herein in accordance with embodiments of the present invention is formed proximate the scribe line region 108 at the exterior edge of the integrated circuit regions 104, as shown. In particular, the crack prevention ring 132/134 is formed continuously along the perimeter 146 of the integrated circuit regions 104. The optional seal rings 130 are shown disposed between the crack prevention rings 132/134 and the integrated circuit regions 104. Note that the corners 152 of the integrated circuit regions 104 may be angled rather than at a 90 degree angle, as shown. Optional test pads 156 that may be formed of the conductive material 124 and that may be disposed within the scribe line region 108 are also shown in FIG. 7. The optional test pads 156 are removed during the singulation process.

Figure 8:
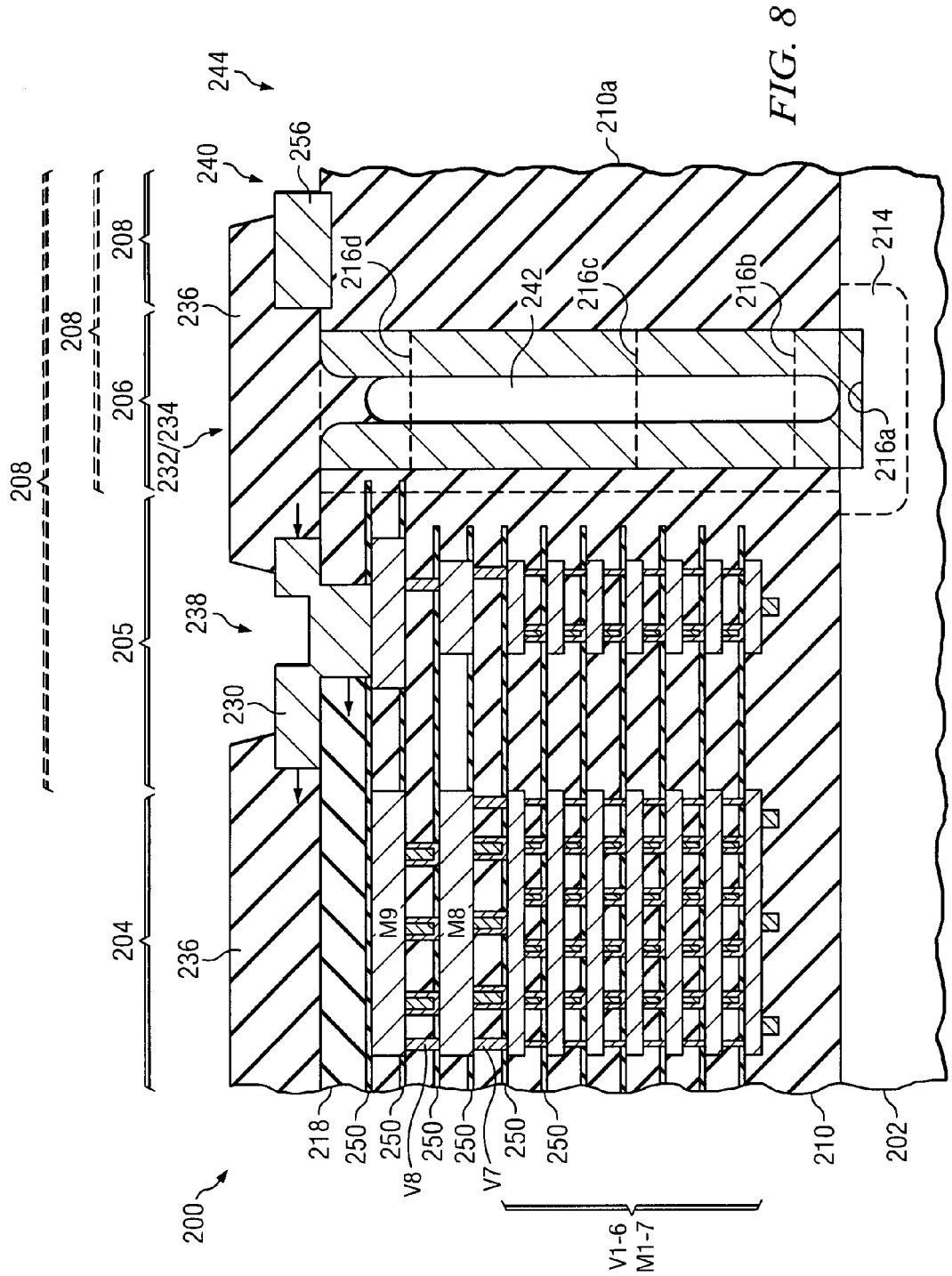
FIG. 8 shows a cross-sectional view of another embodiment of the present invention, wherein the crack prevention ring is partially filled with a conductive material and also includes an air pocket, an optional seal ring is shown, and wherein the integrated circuit comprises multiple metallization and via layers formed therein.

FIG. 8 shows a cross-sectional view of another embodiment of the present invention, wherein the integrated circuit regions 204 comprise multiple levels of metallization M1-9 and vias V1-8 formed therebetween. Similar reference numbers are designated for the various elements as were used in FIGS. 1 through 7. To avoid repetition, each reference number shown in the diagram is not described again in detail herein. Rather, similar numbers x02/x04/x06, etc., are preferably used for the material layers shown as were described for FIGS. 1 through 7, where x=1 in FIGS. 1 through 7 and x=2 in FIG. 8. As an example, the preferred and alternative materials listed for the conductive material 124 in the description for FIGS. 1 through 6 are preferably also used for the conductive material 224 in FIG. 8.

An etch stop layer 250 may be disposed between each insulating layer, as shown. The scribe line region 208 may optionally include the crack prevention ring region 206, or may include both the crack prevention ring region 206 and a seal ring region 205, as shown in phantom. The materials in the scribe line region 208 are removed or sawed away when the die are singulated, for example.

Preferably, in the embodiment shown in FIG. 8, the crack prevention ring 232 or 234 in the crack prevention ring region 206 extends down to a corresponding level in the integrated circuit region 204 past at least the top metallization layer M9, as shown at 216d in FIG. 8. Alternatively, the crack prevention ring 232 or 234 may extend past several metallization layers M4 through M9 and via levels V4 through V8, as shown at 216c. Alternatively, the crack prevention ring 232 or 234 may extend past all of the metallization layers M1 through M9 and via layers V1 through V8, as shown at 216b. In yet another embodiment, the crack prevention ring 232 or 234 may be formed so that it extends entirely through the integrated circuit region 210a of the semiconductor device 200 and further extends into a portion of the workpiece 202, as shown at 216a. In one embodiment, the crack prevention ring 232 or 234 may also extend at least partially through an STI region 214 formed within the workpiece 202, as shown in phantom in FIG. 8.

Advantages of embodiments of the invention include providing a method of forming a crack prevention ring 132, 134, 232, or 234 proximate a scribe line region 140 and 240 of an integrated circuit 100 and 200. The crack prevention ring 132, 134, 232, or 234 may be formed at the same time as seal rings 130 and 230 and/or test pads 156/256 that are used to perform electrical tests on the integrated circuit die 148. Because the crack prevention ring 132, 134, 232, or 234 is formed using the same conductive material 124 or 224 and lithography masks that are used to form the seal rings 130 and 230 that may already be included in a semiconductor device, no additional manufacturing steps or masks are required to manufacture the semiconductor devices 100 and 200 described herein. The crack prevention rings 132, 134, 232, and 234 described herein are particularly advantageous when used in semiconductor devices 100 and 200 having low dielectric constant materials or ultra-low dielectric constant materials as insulating layers, although they are also useful in other semiconductor device applications utilizing other types of insulating materials. The crack prevention rings 132, 134, 232, and 234 prevent delamination of the insulating layers of the semiconductor devices 100 and 200 during the separation of the individual die 148.

The conductive material 124 or 224 of the crack prevention ring 132, 134, 232 or 234 comprises a continuous metal film formed perpendicular to the wafer surface through one or more layers of a semiconductor device. The crack prevention ring 132, 134, 232, or 234 is formed vertically in a plurality of material layers 110/210, preventing cracks that may otherwise tend to form laterally in a direction parallel to the wafer surface during the singulation process. The conductive material 124 or 224 of the crack prevention ring 132, 134, 232 or 234 is advantageously positioned perpendicular to the crack direction, preventing crack formation.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device comprising:
   an integrated circuit;
   a plurality of metallization layers, the plurality of metallization layers comprising a first metallization layer and at least one second metallization layer disposed over the first metallization layer, wherein each metallization layer is formed in an insulating layer;
   a scribe line adjacent the integrated circuit;
   a seal ring substantially surrounding the integrated circuit;
   a crack prevention ring disposed around an exterior edge of the integrated circuit, the crack prevention ring being interjacent the seal ring and the scribe line and comprising a conductive material and extending into a plurality of non-conductive layers at least to a depth of the at least one second metallization layer, wherein the crack prevention ring comprises a trench at least partially filled with the conductive material, and wherein the crack prevention ring trench is lined with the conductive material; and
   a passivation layer disposed over the integrated circuit and the crack prevention ring, wherein the crack prevention ring includes an air pocket disposed beneath the passivation layer.

2. The semiconductor device according to claim 1, wherein the conductive material is selected from a group consisting essentially of copper, aluminum, silver, tungsten, metal nitride, metal alloy, copper alloy, aluminum alloy, composites thereof, or combinations thereof.

3. The semiconductor device according to claim 1, wherein the crack prevention ring trench comprises a width of about 0.3 to 10 μm or less and a depth of about 1 to 8 μm.

4. The semiconductor device according to claim 1, wherein the crack prevention ring trench has an aspect ratio of about 3:1 or greater.

5. The semiconductor device according to claim 1, wherein the conductive material lining the crack prevention ring trench comprises a thickness of about 2000 nm or less.

6. The semiconductor device according to claim 1, wherein the crack prevention ring extends into a plurality of non-conductive layers at least to a depth of the first metallization layer.

7. The semiconductor device according to claim 1, wherein the crack prevention ring extends through the integrated circuit to a workpiece.

8. A semiconductor device comprising:
   an integrated circuit;
   a plurality of metallization layers, the plurality of metallization layers comprising a first metallization layer and at least one second metallization layer disposed over the first metallization layer, wherein each metallization layer is formed in an insulating layer;
   a scribe line adjacent the integrated circuit;
   a seal ring substantially surrounding the integrated circuit;
   a crack prevention ring disposed around an exterior edge of the integrated circuit, the crack prevention ring being interjacent the seal ring and the scribe line and comprising a conductive material and extending into a plurality of non-conductive layers at least to a depth of the at least one second metallization layer; and
   a shallow trench isolation (STI) region formed therein, wherein the crack prevention ring extends into the STI region of a workpiece.

9. The semiconductor device according to claim 8, wherein the seal ring comprises a trench having a width of about 10 μm or less.

10. The semiconductor device according to claim 8, wherein the integrated circuit comprises at least one low-k dielectric layer.

11. The semiconductor device according to claim 10, wherein the at least one low-k dielectric layer comprises a low-k dielectric layer having a dielectric constant of less than about 3.5.

12. The semiconductor device according to claim 10, wherein the at least one low-k dielectric layer comprises a chemical vapor deposition (CVD) dielectric layer, SiOC, SiOCN, spin-on SiOC, a CVD polymer, a spin-on polymer, fluorinated silicate glass (FSG), SiO2, or combinations thereof.

13. A semiconductor device comprising:
   a semiconductor wafer;
   a plurality of integrated circuits formed on the semiconductor wafer;
   a series of scribe lines interjacent and separating respective ones of the plurality of integrated circuits;
   at least one of said plurality of integrated circuits including:
      a first metallization layer extending a first depth from a top surface of the at least one integrated circuit, and at least one second metallization layer disposed over the first metallization layer and extending a second depth from the top surface of the integrated circuit;
      a seal ring formed around a periphery of the at least one integrated circuit;
      a crack prevention ring formed in a Wench along the periphery of the at least one integrated circuit, wherein the Wench is located between the seal ring and the adjacent scribe line, and wherein the trench extends at least to the second depth of the at least one second metallization layer and wherein the trench is partially filled with a conductive material and
   a shallow trench isolation (STI) region formed therein, wherein the crack prevention ring extends into the STI region of a workpiece.

14. The semiconductor device of claim 13 wherein the seal ring is formed in a top passivation layer of the at least one integrated circuit.

15. The semiconductor device of claim 13, wherein the crack prevention ring trench comprises a width of about 0.3 to 10 μm or less and a depth of about 1 to 8 μm.

16. The semiconductor device of claim 13, wherein the trench is lined with the conductive material.

17. The semiconductor device of claim 16, wherein the conductive material lining the crack prevention ring trench comprises a thickness of about 2000 nm or less.

* * * * *

UNITED STATES PATENT AND TRADEMARK OFFICE
CERTIFICATE OF CORRECTION

PATENT NO. : 7,586,176 B2  Page 1 of 1
APPLICATION NO. : 11/788208
DATED : September 8, 2009
INVENTOR(S) : Wang et al.

It is certified that error appears in the above-identified patent and that said Letters Patent is hereby corrected as shown below:

In Col. 10, line 39, delete "Wench" and insert --trench--.
In Col. 10, line 41, delete "Wench" and insert --trench--.
In Col. 10, line 45, after material insert --;--.

Signed and Sealed this

Tenth Day of November, 2009

David J. Kappos
*Director of the United States Patent and Trademark Office*